(12) United States Patent
Young et al.

(10) Patent No.: US 7,890,917 B1
(45) Date of Patent: Feb. 15, 2011

(54) METHOD AND APPARATUS FOR PROVIDING SECURE INTELLECTUAL PROPERTY CORES FOR A PROGRAMMABLE LOGIC DEVICE

(75) Inventors: Jay T. Young, Louisville, CO (US); Jeffrey M. Mason, Eldorado Springs, CO (US)

(73) Assignee: Xilinx, Inc., San Jose, CA (US)

( * ) Notice: Subject to any disclaimer, the term of this patent is extended or adjusted under 35 U.S.C. 154(b) by 434 days.

(21) Appl. No.: 12/008,848

(22) Filed: Jan. 14, 2008

(51) Int. Cl.
*G06F 17/50* (2006.01)
(52) U.S. Cl. ...................... 716/117; 716/116
(58) Field of Classification Search .............. 716/16, 716/17
See application file for complete search history.

(56) References Cited

U.S. PATENT DOCUMENTS

| | | | |
|---|---|---|---|
| 6,173,434 B1 | 1/2001 | Wirthlin et al. | |
| 6,817,005 B2 | 11/2004 | Mason et al. | |
| 6,903,574 B2 * | 6/2005 | Chen et al. | 326/41 |
| 7,430,728 B1 * | 9/2008 | Rahut | 716/6 |
| 7,521,961 B1 * | 4/2009 | Anderson | 326/41 |
| 7,525,345 B2 * | 4/2009 | Jang | 326/83 |
| 7,620,863 B1 * | 11/2009 | Trimberger | 714/725 |
| 7,640,527 B1 * | 12/2009 | Dorairaj et al. | 716/16 |
| 7,673,271 B1 * | 3/2010 | Becker et al. | 716/16 |
| 2002/0199110 A1 * | 12/2002 | Kean | 713/189 |
| 2008/0028187 A1 * | 1/2008 | Casselman et al. | 712/37 |

OTHER PUBLICATIONS

U.S. Appl. No. 11/238,433, filed Sep. 28, 2005, Mason et al., entitled, "Method and Apparatus for Modular Circuit Design for a Programmable Logic Device", Xilinx, Inc. 2100 Logic Drive, San Jose, CA.
U.S. Appl. No. 11/225,248, filed Sep. 12, 2005, Jay T. Young, entitled, "Design Methodology to Support Relocatable Bit Streams for Dynamic Partial Reconfiguration of FPGAs to Reduce Bit Stream Memory Requirements", Xilinx, Inc. 2100 Logic Drive, San Jose, CA.

* cited by examiner

*Primary Examiner*—Thuan Do
*Assistant Examiner*—Magid Y Dimyan
(74) *Attorney, Agent, or Firm*—Robert M. Brush

(57) ABSTRACT

Method and apparatus for providing secure intellectual property (IP) cores for a programmable logic device (PLD) are described. An aspect of the invention relates to a method of securely distributing an IP core for PLDs. A circuit design is generated for the IP core, the circuit design being re-locatable in a programmable fabric for PLDs. The circuit design is encoded to produce at least one partial configuration bitstream. Implementation data is generated for utilizing the IP core as a reconfigurable module in top-level circuit designs. The at least one partial configuration bitstream and the implementation data are delivered to users of the PLDs.

20 Claims, 5 Drawing Sheets

US 7,890,917 B1

METHOD AND APPARATUS FOR PROVIDING SECURE INTELLECTUAL PROPERTY CORES FOR A PROGRAMMABLE LOGIC DEVICE

FIELD OF THE INVENTION

One or more aspects of the present invention relate generally to integrated circuit design and, more particularly, to a method and apparatus for providing secure intellectual property cores for a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured.

Presently, pre-packaged circuit designs are available for FPGAs, which are referred to as intellectual property cores (IP cores). IP cores typically provide sub-circuits or "modules" that operate in accordance with established specifications (e.g., in accordance with particular timing). IP cores allow a user of an FPGA to generate a design more quickly and with fewer bugs. Thus, users are willing to pay for IP cores to speed up their design process. As the complexity of IP cores has increased, so has the required investment in labor and finances by the designers that create them. Given their increased complexity, expense, and value, it is desirable to protect them from unauthorized use.

Currently, designers bundle and license IP cores to users. Once a license is granted, a user is able to instantiate the IP core logic into his or her design and may at this point visualize the implementation. This IP core in the design is then identical to any other logic that can be analyzed by design tools. Thus, the user is free to slightly modify a licensed IP core that may then be freely shared with other users. To an IP core designer, this distribution of modified IP cores is lost revenue. Accordingly, there exists a need in the art for generating IP cores in a secure form that cannot be visualized or modified by users.

SUMMARY OF THE INVENTION

An aspect of the invention relates to a method of securely distributing an intellectual property (IP) core for programmable logic devices (PLDs). A circuit design is generated for the IP core, the circuit design being re-locatable in a programmable fabric for PLDs. The circuit design is encoded to produce at least one partial configuration bitstream. Implementation data is generated for utilizing the IP core as a reconfigurable module in top-level circuit designs. The at least one partial configuration bitstream and the implementation data are delivered to users of the PLDs.

An aspect of the invention relates to a method of utilizing a secure intellectual property (IP) core in a programmable logic device (PLD). At least one partial configuration bitstream and implementation data are obtained for the IP core. The at least one partial configuration bitstream encodes at least one implementation of a circuit design for the IP core. The circuit design is re-locatable in a programmable fabric of the PLD. A top-level circuit design having the IP core is implemented where, based on the implementation data, the IP core is located in the programmable fabric as a reconfigurable model and the top-level circuit design is interfaced with the reconfigurable model. A design configuration bitstream is generated for the top-level circuit design. A selected one of the at least one partial configuration bitstream is merged with the design configuration bitstream.

An aspect of the invention relates to an apparatus for utilizing a secure intellectual property (IP) core in a programmable logic device. A database is configured to store at least one partial configuration bitstream and implementation data for the IP core. The at least one partial configuration bitstream encodes at least one implementation of a circuit design for the IP core. The circuit design is re-locatable in a programmable fabric of the PLD. A place-and-route tool is configured to implement a top-level circuit design having the IP core where, based on the implementation data, the IP core is located in the programmable fabric as a reconfigurable module and the top-level circuit design is interfaced with the reconfigurable module. A bitstream generator is configured to generate a design configuration bitstream for the top-level circuit design and merge a selected one of the at least one partial configuration bitstream with the design configuration bitstream.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
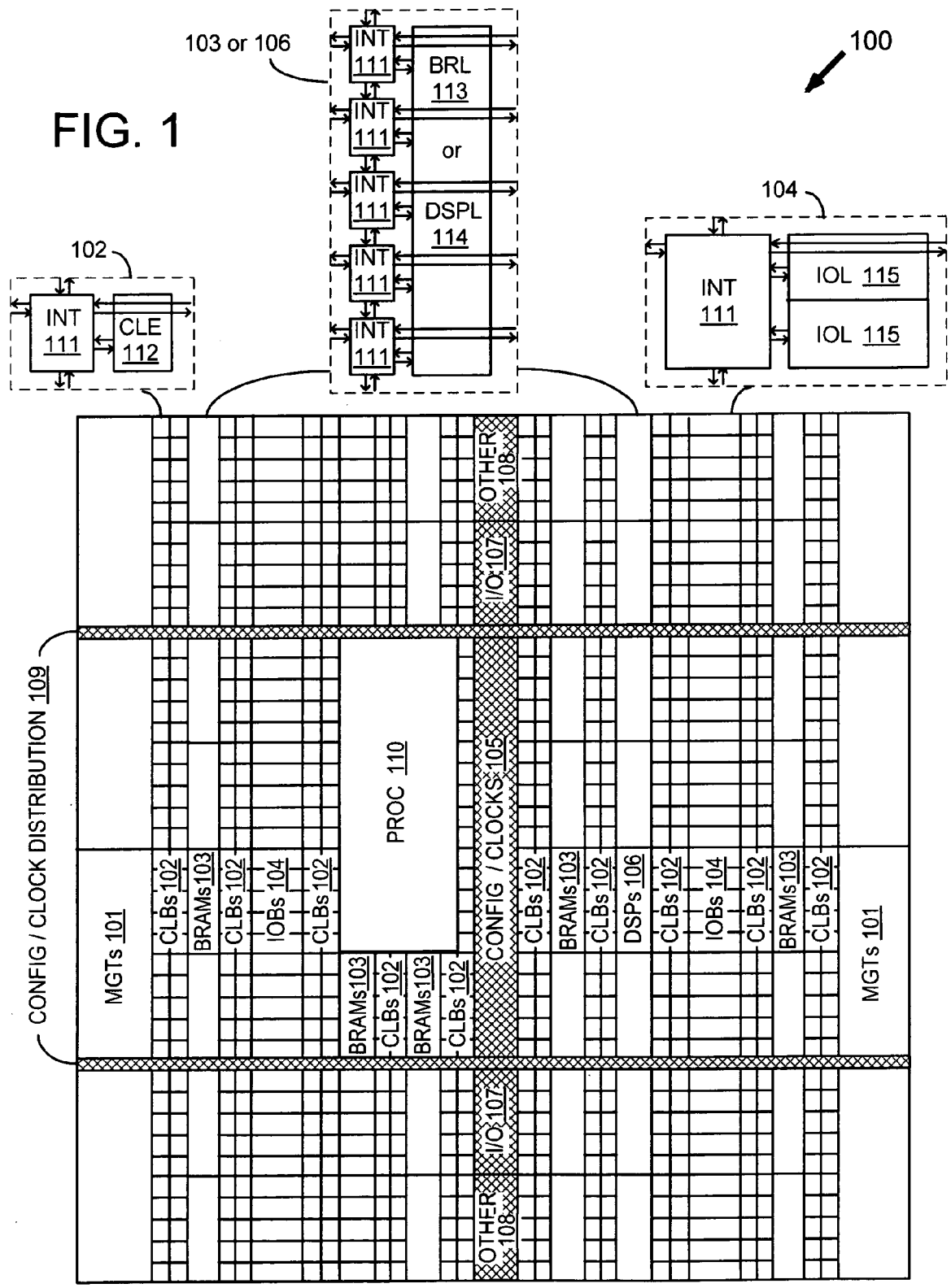
FIG. 1 illustrates an exemplary FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

Figure 2:
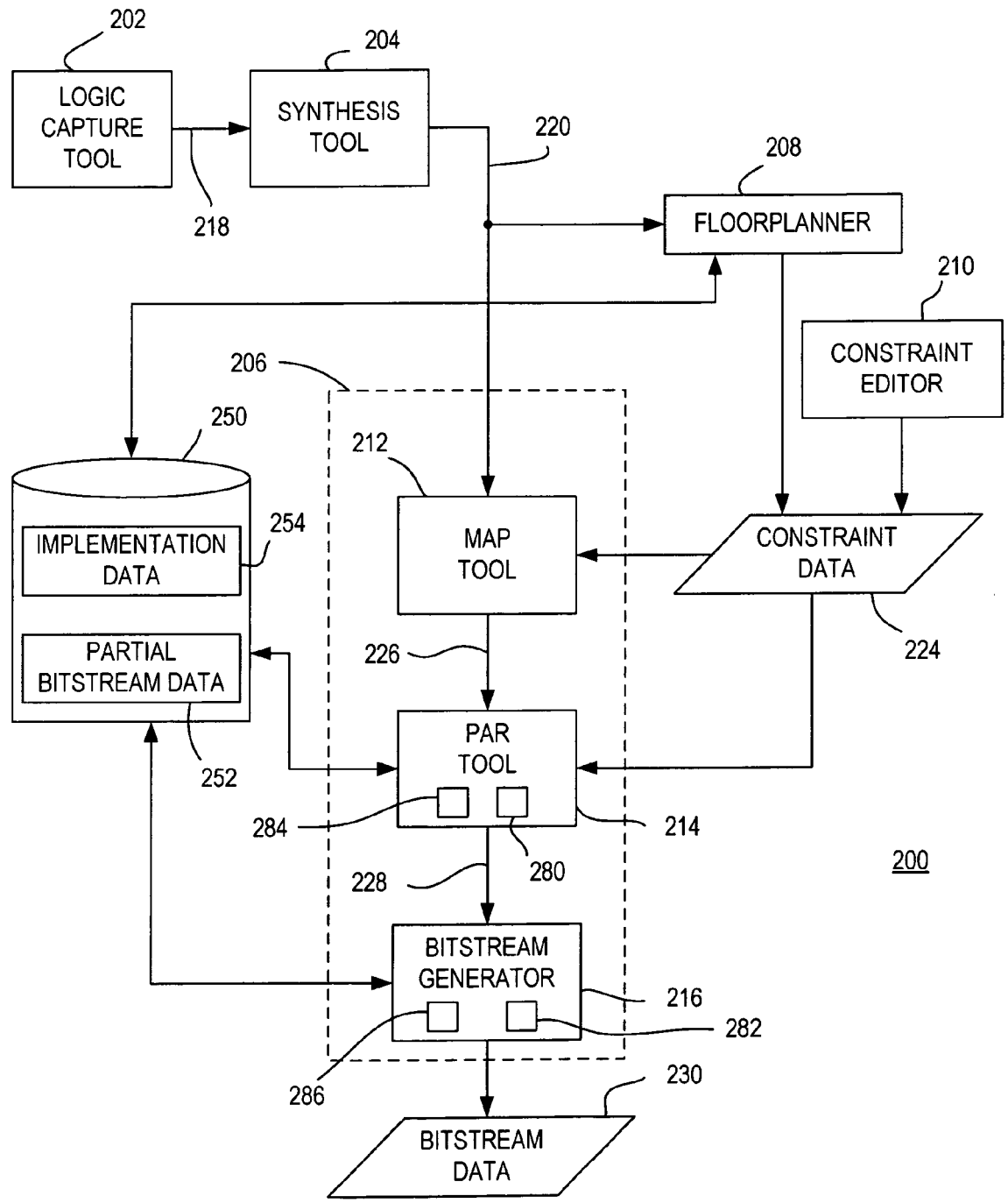
FIG. 2 is a block diagram depicting exemplary embodiments of a logic design system for a programmable logic device (PLD) in accordance with one or more aspects of the invention.

FIG. 2 is a block diagram depicting exemplary embodiments of a logic design system 200 for a programmable logic device (PLD) in accordance with one or more aspects of the invention. In some embodiments, the system 200 includes a logic capture tool 202, a synthesis tool 204, a floorplanner tool 208, a constraint editor tool 210, and an implementation tool 206. The system 200 is configured to implement a logic design using a target PLD, such as an FPGA. Accordingly, the implementation tool 206 includes a map tool 212, a place-and-route (PAR) tool 214, and a bitstream generator tool 216.

The term "tool" is meant to encompass hardware, software, and hardware/software embodiments. For example, the tools in the system 200 may be implemented using hardware, such as using one or more integrated circuits (e.g., an FPGA implementation) that is/are configured to perform the functions of the tools, as described herein. The tools in the system 200 may be part of one or more software programs stored in a memory and configured for execution by a processor (e.g., software executed by a computer). That is, the tools may be software modules. In yet another embodiment, the tools in the system 200 may be implemented using hardware (e.g., integrated circuit(s)) that is configured to perform the functions of the tools by execution of software. That is, the tools are hardware modules that execute software to perform their respective functions.

One or more aspects of the invention relate to distributing and utilizing secure intellectual property (IP) cores for PLDs. As described further below, the IP cores are distributed as partial configuration bitstreams ("partial bitstreams"). To use the IP cores, users generate a logic design using a partial reconfiguration design flow. In the partial reconfiguration design flow, the logic design is divided into a top-level design having modules. Each of the modules is either a static module or a reconfigurable module. A reconfigurable module is capable of partial dynamic active reconfiguration when the target FPGA is active via a partial reconfiguration process. Once the target FPGA is active, a static module is fixed and cannot be reconfigured. For further details associated with a partial reconfiguration design flow, the reader is referred to U.S. patent application Ser. No. 11/238,433, filed Sep. 28, 2005 by Jeffrey M. Mason, which is incorporated by reference herein in its entirety.

The IP cores are designed to be used as reconfigurable modules in a user's logic design. In essence, a user "plugs-in" an IP core (reconfigurable module) to his or her design.

Accordingly, a core designer employs embodiments of the system 200 to design IP cores as reconfigurable modules. A user of the IP cores employs embodiments of the system 200 to generate a top-level design that interfaces the reconfigurable modules of the IP cores. The user only has access to the partial bitstream that encodes the reconfigurable module of an IP core, as well as implementation data describing the external interface. The user cannot view any of the internal logic of the IP core. For purposes of clarity by example, the logic design system 200 is described immediately below with respect to a logic design in general. Features of the design system 200 that pertain specifically to design of the IP cores, and specifically to design of the top-level logic and interfacing of the top-level logic with IP cores, are described thereafter.

The logic capture tool 202 is configured to capture a circuit design from a user and generate a behavioral description 218 of the circuit design. The behavioral description 218 includes a plurality of circuit components, such as flip-flops, memories, LUTs, and the like, connected together via signal conductors (nets). The logic capture tool 202 may include a graphic interface through which a designer connects symbols and blocks representing various components to produce a schematic description of the circuit design. The logic capture tool 202 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 204 is configured to receive the behavioral description 218. The synthesis tool 204 processes the behavioral description 218 to produce a logical description 220 of the circuit design. The logical description 220 includes a logical network list ("netlist") of lower-level circuit elements and logic gates, as well as connections (nets) between inputs and outputs thereof, in terms of the hierarchy specified in the behavioral description 218. For example, the logical description 220 may be compliant with the Electronic Design Interchange Format (EDIF). The synthesis tool 204 may also generate constraint data associated with the logical description 220 that includes various timing and layout constraints. Alternatively, the logical description 220 may be annotated with constraint data. Such an annotated netlist is produced by XST synthesis tool, commercially availably by Xilinx, Inc., of San Jose, Calif.

The floorplanner tool 208 is configured to receive the logical description 220. The floorplanner 208 may comprise a graphical tool that gives a designer control over location of circuit components of a logic design in the target FPGA. In one embodiment, the floorplanner 208 displays a hierarchical representation of the logic design in a window of a graphic interface using hierarchy structure lines and colors to distinguish the different hierarchical levels. The window displays the floorplan of the target FPGA (programmable fabric) and allows the designer to draw rectangles into which the designer places logic from the hierarchy. The floorplanner 208 generates various constraints that are provided as part of constraint data 224. Such constraints include positions and ranges of logic blocks. A designer may use the constraint editor tool 210 to add various constraints to the constraint data 224, such as PERIOD constraints (i.e., the time between rising edges of a clock signal) for all clocks, as well as input/output (IO) timing constraints (time between two pins, typically measured from a clock input at a first pin and data out at a second pin) for IOs.

The map tool 212 is configured to receive the logical description 220 and the constraint data 224. The map tool 212 maps the logical description 220 onto physical resources within the target FPGA (i.e., the circuit components, logic gates, and signals are mapped onto LUTs, flip-flops, clock buffers, I/O pads, and the like of the target FPGA). The map tool 208 produces a mapped circuit description 226 in accordance with any constraints in the constraint data 224. The mapped circuit description 226 includes groupings of the physical resources of the target FPGA expressed in terms of CLBs and IOBs that include these resources.

The PAR tool 214 is configured to receive the mapped circuit description 226 and the constraint data 224. The PAR tool 214 determines placement for the physical resource groupings of the mapped circuit description 226 in the target FPGA and apportions the appropriate routing resources. The PAR tool 214 performs such placement and routing in accordance with any constraints in the constraint data 224. The PAR tool 214 produces physical design data 228. The bitstream generator tool 216 is configured to receive the physical design data 228 and produce bitstream data 230 for the target FPGA.

Figure 3:
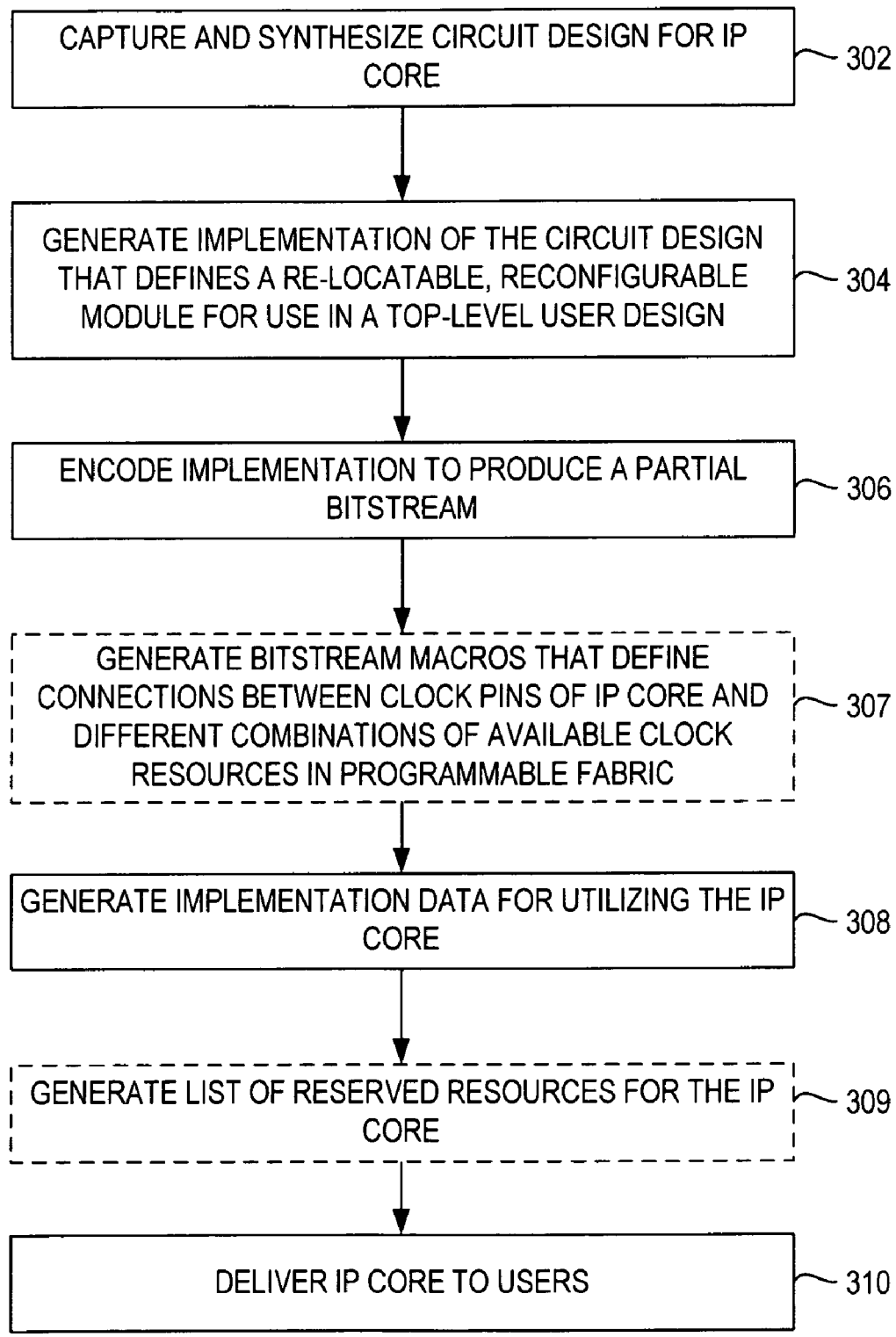
FIG. 3 is flow diagram depicting exemplary embodiments of a method of generating and distributing a secure intellectual property (IP) core in accordance with one or more aspects of the invention.

FIG. 3 is flow diagram depicting exemplary embodiments of a method 300 of generating and distributing a secure IP core in accordance with one or more aspects of the invention. A developer of the secure IP core (also referred to as the IP core designer) may use embodiments of the system 200 to produce the secure IP core in accordance with the method 300. The method 300 begins at step 302, where a circuit design for the IP core is captured and synthesized using the logic capture tool 202 and synthesis tool 204, respectively. At step 304, at least one implementation of the circuit design is generated, each defining a re-locatable, reconfigurable module for use in a top-level user design. By re-locatable, it is meant that the IP core circuit design is not fixed to a particular implementation area ("area") of the programmable fabric, but is rather locatable in any one of a plurality of areas.

An "area" in the programmable fabric refers to a region encompassing particular resources, including specific logic and routing resources. As shown in the example of FIG. 1, a PLD such as an FPGA may include columns of tiles. In such case, an area may be defined in terms of columns and rows of tiles. An area may also be defined in terms of configuration frames or a partial bitstream used to program such configuration frames. A configuration frame or "frame" is a set of configuration bits that control configuration of particular logic and routing resources in the programmable fabric. Thus, an area of resources also encompasses a set of frames that control configuration of such resources. The set of frames in an area is programmed using particular sequence of bits referred to as a partial bitstream. A complete bitstream includes bits for programming all frames of a device.

A circuit design may be re-locatable in the programmable fabric by restricting the implementation of design rules for a PLD. The design rules are provided to enable a circuit to be implemented in one area with a single partial bitstream (e.g., a default area), where the same single partial bitstream can be relocated to implement the same circuit in other areas of the PLD. The design rules initially require that the same frames having the same relative orientation be available in all areas where a partial bitstream can be located. Stated differently, the design rules require that the same logic and routing resources having the same orientation be available in areas where the circuit design can be located. Under the design rules, a design can be generated by initially specifying areas of the PLD where the re-locatable partial bitstream can be located. Next, verification is performed in the areas to assure frame areas oriented in the same relative manner are available to store the partial bitstream in each area. Next, placing and routing of the circuit design can be performed using routing resources in the default area. For further details associated with re-locatable partial bitstreams, the reader is referred to U.S. patent application Ser. No. 11/225,248 filed Sep. 12, 2005, by Jay T. Young, which is incorporated by reference herein in its entirety.

In some embodiments, multiple implementations of the circuit design are generated at step 304. The implementations may provide for different footprints within the FPGA fabric (e.g., different shapes, different sizes). The implementations may provide for different input/output (I/O) interfaces. The multiple different implementations allow the PAR tool 214 to select a "best" implementation based on placement requirements, timing requirements, and the like. For example, a given circuit design may have one implementation that allows for horizontal left-to-right input-to-output paths, and one implementation that allows for horizontal right-to-left input-to-output paths. In another example, a given circuit design may have one implementation that is optimized for area, and another implementation that is optimized for speed. Those skilled in the art will appreciate that various other types of different implementations may be produced for a given circuit design.

Returning to FIG. 3, at step 306, each circuit design implementation is encoded to produce a partial bitstream using the bitstream generator tool 216. As discussed above, the partial bitstream for a given implementation is re-locatable with respect to the programmable fabric of the PLD. At step 308, implementation data for utilizing the reconfigurable module of the IP core is generated. Embodiments of the implementation data are discussed below. Together, the partial bitstream(s) and the implementation data comprise a secure IP core. At step 310, the secure IP core is delivered to users.

Figure 4:
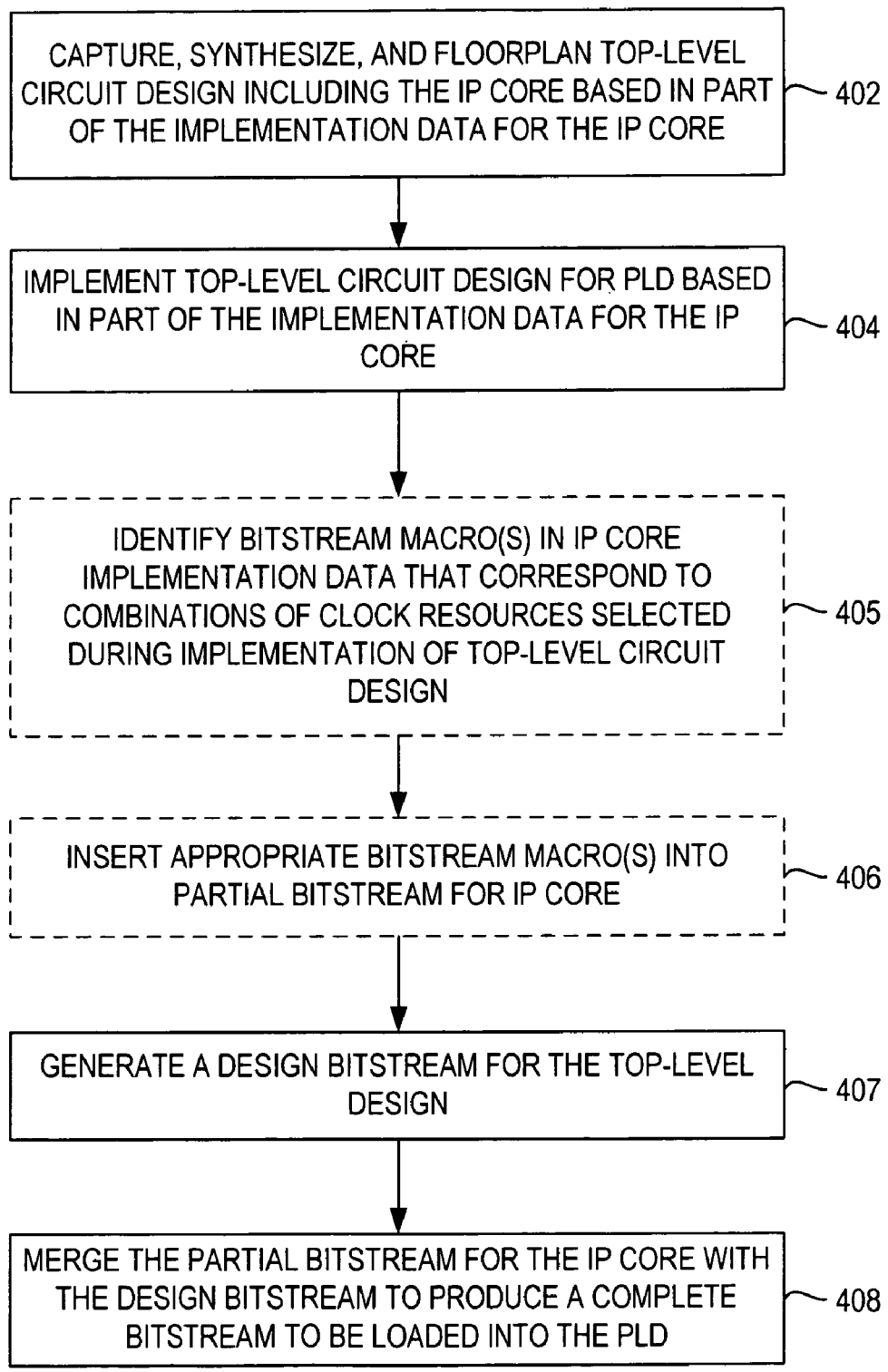
FIG. 4 is a flow diagram depicting an exemplary embodiment of a method of utilizing a secure IP core in accordance with one or more aspects of the invention.

FIG. 4 is a flow diagram depicting a method 400 of utilizing a secure IP core in accordance with one or more aspects of the invention. A user of the secure IP core may use embodiments the system 200 to produce a logic design having the secure IP core in accordance with the method 400. Notably, in some embodiments, the system 200 includes a database 250 for storing IP cores that have been generated and distributed according to the method 300. In the example of FIG. 2, the database 250 stores at least one partial bitstream 252 and implementation data 254 comprising an IP core. The database 250 is coupled to the flooplanner tool 208, the PAR tool 214, and the bitstream generator tool 216.

The method 400 begins at step 402, where a top-level circuit design including the IP core is captured, synthesized, and floorplanned based in part on the implementation data. Capture, synthesis, and floorplanning is carried out using the logic capture tool 202, the synthesis tool 204, and the floorplanner tool 308, respectively. The top-level circuit design includes the IP core, which is located in the programmable fabric as a reconfigurable module. The implementation data 254 may include a definition of an external interface for the IP core. In case there are multiple partial bitstreams for multiple implementations, the implementation data 254 may include a definition for an external interface of each of the implementations. In general, each external interface of the IP core circuit includes input pins, output pins, and clock pins. The input and output pins are generally referred to as input/output (IO) pins. The definition of the IP core external interface allows the tools to couple other portions of the top-level circuit design with the IP core.

The implementation data 254 may further include a configuration frame area used by the IP core (i.e., implementation area) and/or configuration frame footprint (i.e., the shape of the IP core in terms of configuration frames). In case of multiple implementations, the implementation data 254 may include configuration frame areas and/or configuration frame footprints for all of the implementations. The IP core may be located in the programmable fabric using frame area/footprint information from the implementation data 254. In some embodiments, other logic in the top-level design cannot be located in the implementation area of the IP core. In other embodiments, this restriction is removed, as described below. The implementation data 254 may include other data relevant to utilizing the IP core, such as fixed timing information for the IP core, instructions on how to use the IP core, and the like.

At step 404, the top-level circuit design is implemented for the PLD based in part on the implementation data. The PAR tool 214 may validate that the IP core can be placed as defined in step 402. The PAR tool 214 routes connections between other portion(s) of the top-level design and the reconfigurable module of the IP core using the external interface definition in the implementation data 254. In some embodiments, the PAR tool 214 may select a particular implementation to be used from a plurality of implementations based results of the placement and routing process. At step 407, a design bitstream is generated for the top-level design. At step 408, a (selected) partial bitstream 252 for the IP core is merged with the design bitstream to produce a complete bitstream to be loaded in the PLD. Specific embodiments of the steps in the method 400 are described below.

In some embodiments, the IP core is designed in the method 300 such that the IO pins are coupled to interface macros. Interface macros are used to fix the entry and exit locations of the IP core in the programmable fabric of the PLD. An interface macro may comprise, for example, a slice of a CLB. These interface macros may be provided as part of the circuit design implementation(s) of the IP core. In such embodiments, the definition of the external interface in the implementation data 254 includes the location, relative to the programmable fabric, of the interface macros. Accordingly, in the method 400, the PAR tool 214 can then route signal connections between other portion(s) of the top-level design and the reconfigurable module of the IP core to the interface macros (step 404).

In some embodiments, the IP core is designed in the method 300 such that the clock pins are driven by specific, pre-defined clock resources (i.e., clock resources selected during implementation of the IP core circuit design). For example, the IP core may be designed such that the clock pins are coupled to one or more clock resources of a clock distribution network in the programmable fabric. For example, the clock distribution network of a PLD may include both horizontal and vertical clock resources. The horizontal clock resources extend across the columns of the programmable fabric, and the vertical resources extend the length of the columns of the programmable fabric. The horizontal resources are typically coupled to a clock spine in the center of the programmable fabric and are configured to distribute clock signals to vertical resources. During PLD configuration, a given vertical resource may be programmably connected to a particular horizontal resource. Clock pins in an IP core may then be connected to one or more vertical resources. At design time, the clock pins of the IP core may be coupled to specific vertical clock resource(s), which are in turn connected to specific horizontal clock resource(s). In such embodiments, the definition of the external interface in the implementation data 254 includes the location, relative to the clock distribution network in the programmable fabric, of the pre-defined clock resources used by the IP core (e.g., which horizontal and vertical resources are used. Accordingly, in the method 400, the PAR tool 214 can then route clock connections to the pre-defined clock resources used by the reconfigurable module of the IP core (step 404).

In embodiments described above, the clock(s) for the IP core may be locked to specific clock resources (e.g., a specific vertical-to-horizontal clock resource connection(s)). This may cause conflicts with different cores both requiring the same clock resources. Thus, in some cases, users may desire that the IP core be produced without being bound to specific clock resources. In order to deal with this issue, it is necessary to allow the IP core to utilize any of a plurality of possible clock resources. That is, the clock resources used by the IP core are not fixed at core design time, but are rather selected during implementation of the core by the user. For example, horizontal clock resource versatility will allow multiple cores to exist left and right of each other. Vertical clock resource versatility will allow multiple cores to exist in the same frame area.

Returning to FIG. 3, in some embodiments, optional step 307 is performed. At optional step 307, bitstream macros are generated that define connections between clock pins of the IP core circuit different combinations of available clock resources in the programmable fabric. Notably, in a given partial bitstream for an IP core, pre-defined bits define which clock resources in the programmable fabric are coupled to the clock pins of the IP core. The bitstream macros convey the necessary bitstream changes (also referred to as bitstream deltas) to implement connections to any selected clock resources. For example, the bitstream macros may include one or more combinations of connections between available vertical clock resources and horizontal clock resources. The bitstream macros may be included within the implementation data 254. Since the clock pins of the IP are not connected to fixed clock resources at design time, the implementation data 254 for the IP core does not include location of pre-defined clock resources. Rather, in some embodiments, the implementation data 254 includes information as to which columns of the IP core, relative to the programmable fabric, that clock(s) must be routed in order to connect all necessary clock pins of the IP core.

If bitstream macros are used, the PAR tool 214 and bitstream generator tool 216 deviate from their default behavior, as described above. Notably, the PAR tool 214 includes logic 280 that routes clock(s) to the IP core columns requiring such clock(s), as set forth in the implementation data 254 (step 404). For example, the PAR tool 214 may route the clocks to the identified IP core columns using particular combination(s) of clock resources, such as a particular combination(s) of horizontal and vertical clock resources. As the clock resources are selected by the PAR tool 214 at implementation-time, a more efficient combination of clock resources may be selected than if the clock resources were fixed during IP core design. Once the PAR tool 214 has selected the particular combination(s) of clock resources, the bitstream generator tool 216 includes logic 282 that identifies bitstream macro(s) in the implementation data 254 that correspond to the selected combination(s) of clock resources (optional step 405). The logic 282 in the bitstream generator tool 216 then inserts the appropriate bitstream macro(s) into the partial bitstream for the IP core (optional step 406). The partial bitstream can then be merged with the design bitstream, as described above (step 408).

In embodiments described above, IO pins in the external interface of the IP core are coupled to interface macros. Interface macros, however, may impart undesirable timing overhead as signal pass in and out. IP cores are typically designed to be fast and/or to utilize minimal logic. Thus, including interface macros with an IP core may detrimentally affect the design and intended operation of the IP core. Use of interface macros provides terminal points of the IP core for purposes of modeling timing in the top-level design. Some timing tools, however, are capable of modeling timing from any point in the logic, including points in the routing of the PLD. Accordingly, in some embodiments, the IP core is designed in the method 300 to include only the logic necessary for the core itself (e.g., without interface macros). The IO pins of the IP core external interface may be routing resources at the edge of the core area. That is, the IP core will include network antennas as IO pins. Since interface macros are not provides, the implementation data 254 for the IP core does not include location of the interface macros. Rather, in some embodiments, the external interface in the implementation data 254 defines the IO pins as particular routing resources relative to the programmable fabric of the PLD. Accordingly, in the method 400, the PAR tool 214 can then route signal connections from other portion(s) of the top-level design to the routing resources (network antennas) of the IP core, as designed in the implementation data 254 (step 404).

In some embodiments described above, the user design logic cannot occupy any of the frame area (implementation area) for the reconfigurable module of the IP core. As a consequence, the PAR tool 214 cannot utilize any resources (logic or routing) within the implementation area of the IP core for the user logic. In some cases, the logic of the IP core may not fully utilize resources in its frame area. Stated differently, the configuration frames required to implement the IP core may consume more resources (logic and routing) than used by the logic of the IP core. Such un-used resources cannot be recaptured if the PAR tool 214 is restricted from using resources in the implementation area of the IP core.

Accordingly, in some embodiments, the aforementioned restriction is removed by allowing bitstream frames to be overlaid or logically "OR'd" together. Returning to FIG. 3, in some embodiments, optional step 309 is performed. At optional step 309, a list of resources (logic and routing) reserved by the IP core is generated. This can be a list of resources used by the IP core or a list of resources that may not be used by another portion of a top-level design. The list of reserved resources may be included as part of the implementation data 254 for the IP core. Accordingly, in the method 400, the PAR tool 214 includes logic 284 that obtains the list of reserved resources from the implementation data 254. During implementation (step 404), the logic 284 allows the PAR tool 214 to use resources in an implementation area of the IP core, as long as such resources are not reserved by the IP core according to the list. Once the top-level design is implemented, the bitstream generator tool 216 folds the partial bitstream of the IP core into the design bitstream. In some embodiments, the base state (default state) of configuration frames (all configuration frames or at least the overlapping configuration frames) is a set of logic '0's. As such, logic 286 in the bitstream generator tool 216 logically ORs the overlapping frames of the partial bitstream and the design bitstream. In other embodiments, the default state of the overlapping configuration frames may be something other that logic '0's (e.g., logic '1's). The bitstream generator 216 must be aware of what the unused state of a configuration frame is in order to properly merge the frames.

In some embodiments described above, the IO pins in the external interface of the IP core are coupled to interface macros or are pre-defined routing resources (network antennas) at the edge of the IP core. In cases where the PAR tool 214 is capable of utilizing resources in the IP core implementation area for other logic, the IO pins of the IP core may be directly used in the external interface. That is, in some embodiments, the implementation data 254 includes the location of the actual IO pins within the IO core. Accordingly, in the method 400, the PAR tool 214 can then route signal connections from other portion(s) of the top-level design to the IO pins of the IP core directly, as designed in the implementation data 254 (step 404). This may require that the PAR tool 214 utilize routing resources in the frame area of the IP core. Thus the PAR tool 214 must utilize the list of reserved resources in order to ensure that resources reserved by the IP core are not used in the routing to the IO pins.

By routing directly to the IO pins of the IP core, routing between the user design and the IO core external interface can be minimized by the PAR tool 214. For example, if a network antenna or interface macro exited the IP core on the left, but the user logic ended up to the right of the IP core, some embodiments described above require the PAR tool 214 to route around the IP core area in order to reach the network antenna/interface macro. If the PAR tool 214 can route directly to the IO pins of the IP core, more efficient routing is achieved. Note that there is a tradeoff between routing efficiency and IP security. It may be that routing directly to the IO pins of the IP core allows the user to interpret at least a portion of the logic structure utilized by the IO core. That is, by including the location of the IO pins, the core designer may give away some of the underlying logic structure of the IP core. If the IP core designer prefers not to disclose location of the IO pins, network antennas or interface macros may be used, as described above.

Figure 5:
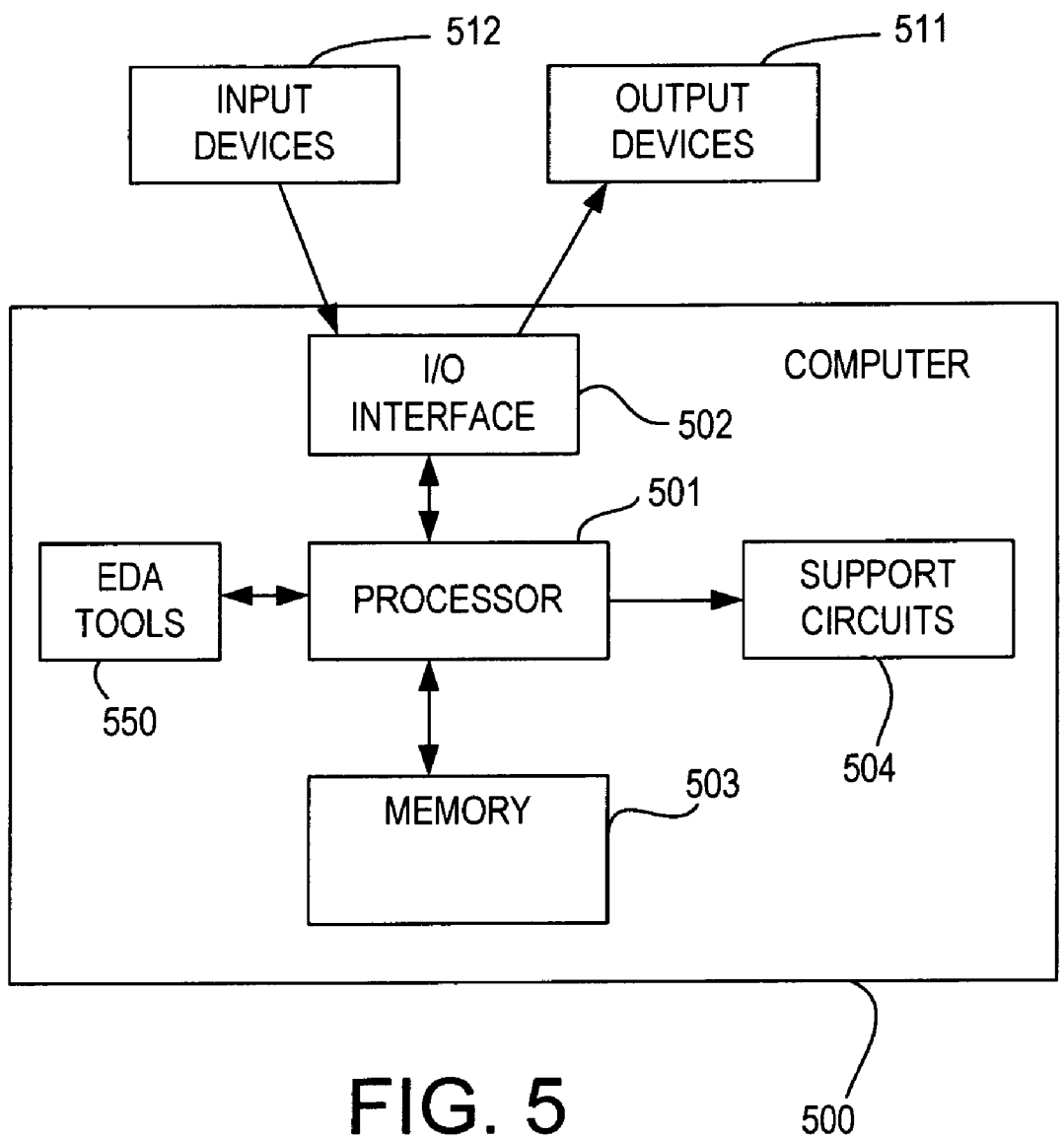
FIG. 5 is a block diagram depicting an exemplary embodiment a computer suitable for implementing the processes described herein in accordance with one or more aspects of the invention.

FIG. 5 is a block diagram depicting an exemplary embodiment a computer 500 suitable for implementing the processes described herein in accordance with one or more aspects of the invention. The computer 500 includes a processor 501, a memory 503, various support circuits 504, and an I/O interface 502. The processor 501 may include one or more microprocessors known in the art. The support circuits 504 for the processor 501 include conventional cache, power supplies, clock circuits, data registers, I/O interfaces, and the like. The I/O interface 502 may be directly coupled to the memory 503 or coupled through the processor 501. The I/O interface 502 is coupled to various input devices 511 (e.g., keyboard, mouse, and the like) and output devices 512 (e.g., display, printer, and the like).

The processor 501 also cooperates with processor-executable instructions and/or data. These processor-executable instructions/data may comprise hardware, firmware, software, and the like, or some combination thereof. Tools having such processor-executable instructions/data include electronic design automation (EDA) tools 550 that may implement logic design systems, such as the system 200 shown in FIG. 2. The EDA tools 550 may include the logic capture tool 202, the synthesis tool 204, the floorplanner tool 208, the constraint editor tool 210, and the implementation tool 206 (e.g., the map tool 212, the PAR tool 214, and the bitstream generator tool 216). The memory 503 may include one or more of the following random access memory, read only memory, magneto-resistive read/write memory, optical read/write memory, cache memory, magnetic read/write memory, and the like, as well as signal-bearing media as described below.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A computer-implemented method of securely distributing an intellectual property (IP) core for programmable devices, comprising:
   generating a circuit design for the IP core using a computer, the circuit design being re-locatable among a plurality of implementation areas of a programmable fabric for the programmable devices;
   encoding the circuit design using the computer to produce at least one partial configuration bitstream;
   generating implementation data using the computer for utilizing the IP core as a reconfigurable module in top-level circuit designs; and
   delivering the at least one partial configuration bitstream and the implementation data to users of the programmable devices.

2. The method of claim 1, wherein the IP core includes interface macros coupled to input/output (IO) pins of the circuit design, and wherein implementation data includes location, in the programmable fabric, of the interface macros.

3. The method of claim 1, wherein the IP core includes clock pins driven by pre-defined clock resources, and wherein the implementation data includes identification, in the programmable fabric, of the pre-defined clock resources.

4. The method of claim 1, further comprising:
   generating configuration bitstream macros representative of connections between clock pins of the IP core and different combinations of clock resources in the programmable fabric;
   wherein the implementation data includes the configuration bitstream macros and location of columns, within the programmable fabric, to which one or more clocks must be routed to drive the clock pins.

5. The method of claim 1, wherein the IP core includes input/output (IO) pins coupled to routing resources at a boundary of the IP core to establish network antennas, and wherein the implementation data includes location, in the programmable fabric, of the network antennas.

6. The method of claim 1, further comprising:
   generating a list of resources in the programmable fabric reserved by the IP core;
   wherein the implementation data includes the list of resources.

7. The method of claim 1, wherein the IP core includes input/output (IO) pins, and wherein the implementation data includes location, in the programmable fabric, of the IO pins.

8. A computer-implemented method of utilizing a secure intellectual property (IP) core in a programmable device, comprising:
   obtaining at least one partial configuration bitstream and implementation data for the IP core, the at least one partial configuration bitstream encoding at least one implementation of a circuit design for the IP core, the circuit design being re-locatable among a plurality of implementation areas of a programmable fabric of the programmable device;
   implementing a top-level circuit design having the IP core using a computer where, based on the implementation data, the IP core is located in the programmable fabric as a reconfigurable model and the top-level circuit design is interfaced with the reconfigurable model;
   generating a design configuration bitstream for the top-level circuit design using the computer; and merging a selected one of the at least one partial configuration bitstream with the design configuration bitstream using the computer.

9. The method of claim 8, wherein the implementation data includes location, in the programmable fabric, of interface macros coupled to input/output (IO) pins of the IP core, and wherein the step of implementing comprises:
routing connections between the top-level circuit design and the interface macros as located.

10. The method of claim 8, wherein the implementation data includes location, in the programmable fabric, of network antennas coupled to input/output (IO) pins of the IP core, and wherein the step of implementing comprises:
routing connections between the top-level circuit design and the network antennas as located.

11. The method of claim 8, wherein the implementation data includes location, in the programmable fabric, of input/output (IO) pins of the IP core, and wherein the step of implementing comprises:
routing connections between the top-level circuit design and the IO pins as located.

12. The method of claim 8, wherein the implementation data includes identification, within the programmable fabric, of pre-defined clock resources driving clock pins of the IP core, and wherein the step of implementing comprises:
routing at least one clock to the pre-defined clock resources as identified.

13. The method of claim 8, wherein the implementation data includes: (a) configuration bitstream macros representative of connections between clock pins of the IP core and different combinations of clock resources in the programmable fabric; and (b) location, within the programmable fabric, of columns to which at least one clock must be routed to drive the clock pins, and wherein the step of implementing comprises:
routing the at least one clock to the columns as located using a selected combination of clock resources.

14. The method of claim 13, wherein the step of merging comprises:
selecting one of the bitstream macros corresponding to the selected combination of clock resources; and
inserting the selected bitstream macro into the selected one of the at least one partial configuration bitstream.

15. The method of claim 8, wherein the implementation data includes a list of resources in the programmable fabric reserved by the IP core, and wherein the step of implementing comprises:
utilizing at least one of logic or routing in the location of the IP core exclusive of the list of resources.

16. Apparatus for utilizing a secure intellectual property (IP) core in a programmable device, comprising:
a database configured to store at least one partial configuration bitstream and implementation data for the IP core, the at least one partial configuration bitstream encoding at least one implementation of a circuit design for the IP core, the circuit design being re-locatable among a plurality of implementation areas of a programmable fabric of the programmable device;
a place-and-route tool configured to implement a top-level circuit design having the IP core where, based on the implementation data, the IP core is located in the programmable fabric as a reconfigurable module and the top-level circuit design is interfaced with the reconfigurable module; and
a bitstream generator configured to generate a design configuration bitstream for the top-level circuit design and merge a selected one of the at least one partial configuration bitstream with the design configuration bitstream.

17. The apparatus of claim 16, wherein the implementation data includes: (a) a list of resources in the programmable fabric reserved by the IP core; and (b) location, in the programmable fabric, of input/output (IO) pins of the IP core, and wherein the place-and-route tool is configured to:
utilize resources in the location of the IP core exclusive of the list of resources, including routing resources required to route connections between the top-level circuit design and the IO pins as located.

18. The apparatus of claim 16, wherein the implementation data includes: (a) configuration bitstream macros that define connections between clock pins of the IP core and combinations of clock resources in the programmable fabric; and (b) location, within the programmable fabric, of columns to which at least one clock must be routed to drive the clock pins, and wherein the place-and-route tool is configured to:
route the at least one clock to the columns as located using a selected combination of clock resources.

19. The apparatus of claim 18, wherein the bitstream generator is configured to:
select one of the bitstream macros corresponding to the selected combination of clock resources; and
insert the selected bitstream macro into the selected one of the at least one partial configuration bitstream.

20. The apparatus of claim 16, wherein the implementation data includes identification, within the programmable fabric, of pre-defined clock resources driving clock pins of the IP core, and wherein the place-and-route tool is configured to:
route at least one clock to the pre-defined clock resources as identified.

* * * * *